(12) United States Patent
Li et al.

(10) Patent No.: US 9,911,618 B2
(45) Date of Patent: Mar. 6, 2018

(54) LOW TEMPERATURE POLY-SILICON THIN FILM TRANSISTOR, FABRICATING METHOD THEREOF, ARRAY SUBSTRATE AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Xinghua Li, Beijing (CN); Junping Bao, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 0 days.

(21) Appl. No.: 15/085,217

(22) Filed: Mar. 30, 2016

(65) Prior Publication Data

US 2016/0329360 A1 Nov. 10, 2016

(30) Foreign Application Priority Data

May 5, 2015 (CN) .......................... 2015 1 0223672

(51) Int. Cl.
*H01L 29/786* (2006.01)
*H01L 21/768* (2006.01)
(Continued)

(52) U.S. Cl.
CPC .... *H01L 21/3085* (2013.01); *H01L 21/30604* (2013.01); *H01L 29/41733* (2013.01);
(Continued)

(58) Field of Classification Search
None
See application file for complete search history.

(56) References Cited

U.S. PATENT DOCUMENTS 5,124,768 A * 6/1992 Mano .................... G02F 1/1368
257/347
5,693,959 A * 12/1997 Inoue ................ H01L 29/78645
257/336
(Continued)

FOREIGN PATENT DOCUMENTS

CN 1236981 A 12/1999
CN 101086968 A 12/2007
(Continued)

OTHER PUBLICATIONS

Office Action dated May 2, 2017 issued in corresponding Chinese Application No. 201510223672.3.
(Continued)

*Primary Examiner* — Stephen W Smoot
(74) *Attorney, Agent, or Firm* — Nath, Goldberg & Meyer; Joshua B. Goldberg

(57) ABSTRACT

Embodiments of the present invention disclose a low temperature poly-silicon thin film transistor and a method of fabricating the same, an array substrate, and a display device. The low temperature poly-silicon thin film transistor comprises an active layer, a source and a drain, wherein the active layer comprises a source contact region, a drain contact region, and a channel region located between the source contact region and the drain contact region, the source is provided above and connected to the source contact region, the drain being provided above and connected to the drain contact region, and thicknesses of the source contact region and the drain contact region are both larger than that of the channel region.

16 Claims, 5 Drawing Sheets

(51) Int. Cl.
*H01L 21/308* (2006.01)
*H01L 29/417* (2006.01)
*H01L 29/66* (2006.01)
*H01L 21/306* (2006.01)

(52) U.S. Cl.
CPC .. *H01L 29/41783* (2013.01); *H01L 29/66757* (2013.01); *H01L 29/78618* (2013.01); *H01L 29/78675* (2013.01)

(56) References Cited

U.S. PATENT DOCUMENTS

| | | | | |
|---|---|---|---|---|
| 2004/0104389 A1* | 6/2004 | Chen | ................... | H01L 29/4908 257/72 |
| 2007/0057326 A1* | 3/2007 | Morikado | ............. | H01L 27/108 257/347 |
| 2007/0072417 A1* | 3/2007 | Nakamura | ........ | H01L 21/76838 438/660 |
| 2007/0252207 A1* | 11/2007 | Park | ........................ | H01L 27/12 257/347 |
| 2008/0191207 A1* | 8/2008 | Nishiura | ........... | H01L 29/66621 257/59 |
| 2014/0159037 A1* | 6/2014 | Kwon | ................ | H01L 29/78618 257/43 |

FOREIGN PATENT DOCUMENTS

| | | |
|---|---|---|
| CN | 101241937 A | 8/2008 |
| CN | 104538402 A | 4/2015 |
| CN | 104576753 A | 4/2015 |
| JP | 4132556 B2 | 8/2008 |

OTHER PUBLICATIONS

The Second Office Action dated Sep. 20, 2017 corresponding to Chinese application No. 201510223672.3.

\* cited by examiner

LOW TEMPERATURE POLY-SILICON THIN FILM TRANSISTOR, FABRICATING METHOD THEREOF, ARRAY SUBSTRATE AND DISPLAY DEVICE

FIELD OF THE INVENTION

The present invention relates to the field of display technology, and particularly relates to a low temperature poly-silicon thin film transistor, a method of fabricating a low temperature poly-silicon thin film transistor, an array substrate comprising the low temperature poly-silicon thin film transistor, and a display device comprising the array substrate.

BACKGROUND OF THE INVENTION

A low temperature poly-silicon (LTPS) thin film transistor liquid crystal display, compared with the traditional amorphous silicon thin film transistor liquid crystal displays, has high electron mobility, which can not only effectively reduce the area of a thin film transistor device to improve aperture ratio, but also reduce power consumption while enhancing brightness of the display. In addition, the relatively high electron mobility allows part of drive circuits to be integrated onto a glass substrate to reduce cost of the drive circuits, and can further greatly enhance the reliability of a liquid crystal display panel, thus greatly reducing the fabricating cost of the panel. Hence, the low temperature poly-silicon thin film transistor liquid crystal display has gradually become a hotspot of research.

FIG. 1 shows a schematic structure diagram of a low temperature poly-silicon thin film transistor in the prior art. As shown in FIG. 1, a source 12 and a drain 13 both come into contact with an active layer 11 through via holes, and in this way, the distance between the drain and a pixel electrode on an array substrate may be decreased, so as to facilitate connection between the pixel electrode and the drain. However, as shown in FIG. 2, in the prior art, an over etching phenomenon is likely to occur during etching the via hole, resulting in poor contact between the source 12, the drain 13 and the active layer 11 after the source 12 and the drain 13 are formed, thus reducing the reliability and yield of the thin film transistor.

SUMMARY OF THE INVENTION

An objective of the present invention is to provide a low temperature poly-silicon thin film transistor, a method of fabricating a low temperature poly-silicon thin film transistor, an array substrate comprising the low temperature poly-silicon thin film transistor, and a display device comprising the array substrate, so as to increase contact areas between a source and an active layer and between a drain and the active layer of the low temperature poly-silicon thin film transistor to enhance the reliability and yield of the thin film transistor.

Embodiments of the present invention provide a low temperature poly-silicon thin film transistor, comprising an active layer, a source and a drain, wherein the active layer comprises a source contact region, a drain contact region, and a channel region located between the source contact region and the drain contact region, the source is provided above and connected to the source contact region, the drain is provided above and connected to the drain contact region, and thicknesses of the source contact region and the drain contact region are both greater than that of the channel region.

An ohmic contact layer may be provided between the source contact region and the source and between the drain contact region and the drain.

The thickness of the source contact region may be the same as that of the drain contact region.

The low temperature poly-silicon thin film transistor may further comprise: a gate provided above the active layer, and a gate insulating layer provided between the gate and the active layer.

The low temperature poly-silicon thin film transistor may further comprise: an interlayer insulating layer provided on the gate, and a source via hole and a drain via hole each penetrating through the gate insulating layer and the interlayer insulating layer, wherein the source is connected to the source contact region through the source via hole, and the drain is connected to the drain contact region through the drain via hole.

The gate insulating layer may comprise a silicon oxide layer provided on the active layer and a silicon nitride layer provided on the silicon oxide layer.

The interlayer insulating layer may comprise a silicon oxide layer provided on the gate and a silicon nitride layer provided on the silicon oxide layer.

Embodiments of the present invention further provide a method for fabricating a low temperature poly-silicon thin film transistor, comprising: forming an active layer, wherein the active layer comprises a source contact region, a drain contact region, and a channel region located between the source contact region and the drain contact region, and thicknesses of the source contact region and the drain contact region are both greater than that of the channel region; and forming a source and a drain above the source contact region and the drain contact region, respectively, so that the source is connected to the source contact region and the drain is connected to the drain contact region.

In the method, forming an active layer may comprise: forming a first amorphous silicon material layer; forming a photoresist layer on the first amorphous silicon material layer, and performing a patterning process to maintain portions of the first amorphous silicon material layer located in a first region and a second region with other portions being removed, so as to form a first intermediate pattern, wherein the first region corresponds to a position where the source contact region is located, and the second region corresponds to a position where the drain contact region is located; forming a second amorphous silicon material layer; forming a photoresist layer on the second amorphous silicon material layer, and performing a patterning process to maintain portions of the second amorphous silicon material layer located in the first region, the second region and a third region with other portions being removed, so as to form a second intermediate pattern, wherein the third region corresponds to a position where the channel region is located; and performing annealing on the first intermediate pattern and the second intermediate pattern, so as to form the active layer.

The method may further comprise performing ion doping on the source contact region and the drain contact region to form an ohmic contact layer.

The method may further comprise forming a gate insulating layer on the active layer, and forming a gate on the gate insulating layer.

The method may further comprise: forming an interlayer insulating layer on the gate; and forming a source via hole penetrating through both the gate insulating layer and the interlayer insulating layer at a position corresponding to the source contact region, and forming a drain via hole penetrating through both the gate insulating layer and the interlayer insulating layer at a position corresponding to the drain contact region.

In the method, the source may be connected to the source contact region through the source via hole, and the drain may be connected to the drain contact region through the drain via hole.

In the method, forming a gate insulating layer may comprise: sequentially forming a silicon oxide layer and a silicon nitride layer on the active layer.

In the method, forming an interlayer insulating layer may comprise: sequentially forming a silicon oxide layer and a silicon nitride layer on the gate.

In the method, an excimer laser annealing process may be adopted to anneal the first intermediate pattern and the second intermediate pattern.

In the method, poly-silicon may laterally grow in the channel region having a smaller thickness to form poly-silicon with a large grain size in the channel region.

In the method, before forming the active layer, the method may further comprise forming a buffer layer on a substrate.

Embodiments of the present invention further provide an array substrate, comprising the aforementioned low temperature poly-silicon thin film transistor provided by the embodiments of the present invention.

Embodiments of the present invention further provide a display device, comprising the aforementioned array substrate provided by the embodiments of the present invention.

In the embodiments of the present invention, since the thicknesses of the source contact region and the drain contact region are greater than that of the channel region, even if certain recesses are formed in the source contact region and the drain contact region due to over etching during etching the via hole, the source and the drain still have relatively large contact areas with the active layer, as a result, reliability and yield of the low temperature poly-silicon thin film transistor are improved, meanwhile, contact resistance is decreased and both turn-on voltage and power consumption of a driving circuit are lowered. Moreover, in the channel region which is relatively thin, poly-silicon grains are prone to growing laterally, so that the grains have relatively large lateral size, and the active layer of the thin film transistor is anisotropic, and thus the active layer of the thin film transistor has good conductivity when the thin film transistor is turned on.

BRIEF DESCRIPTION OF THE DRAWINGS

The accompanying drawings, which constitute a part of the specification, are used for providing further understanding of the present invention, and are used for explaining the present invention together with following specific embodiments, but not for limiting the present invention. In the drawings.

DESCRIPTION OF THE PREFERRED EMBODIMENT

Specific implementations of the present invention will be described in detail below with reference to the accompanying drawings. It should be understood that the specific implementations described here are only used for illustrating and explaining the present invention but not for limiting the present invention.

Figure 1:
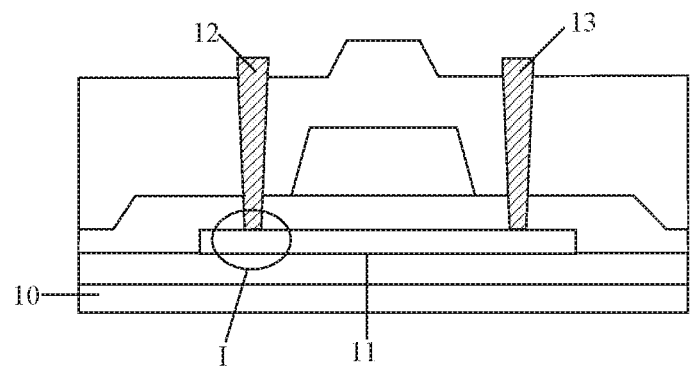
FIG. 1 is a schematic structure diagram of a low temperature poly-silicon thin film transistor in the prior art.
Figure 2:
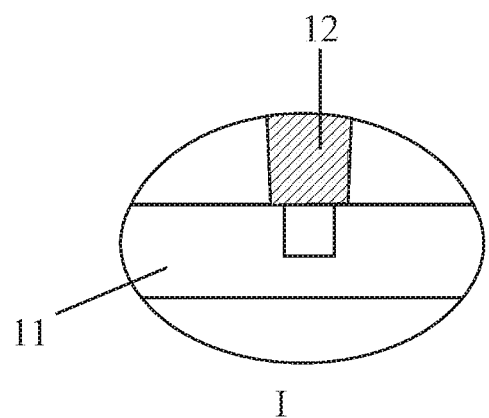
FIG. 2 is an enlarged schematic view of Portion I of the low temperature poly-silicon thin film transistor in FIG. 1 in the case of over etching.
Figure 3:
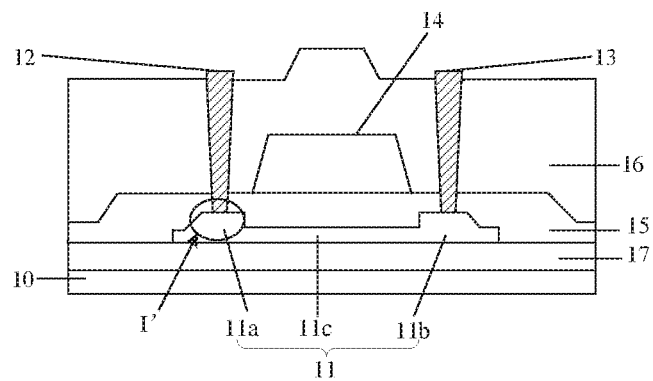
FIG. 3 is a schematic structure diagram of a low temperature poly-silicon thin film transistor of an embodiment of the present invention.

As a first aspect of the present invention, the embodiments of the present invention provide a low temperature poly-silicon thin film transistor. As shown in FIG. 3, the low temperature poly-silicon thin film transistor comprises an active layer 11, a source 12 and a drain 13. The active layer 11 comprises a source contact region 11a, a drain contact region 11b, and a channel region 11c located between the source contact region 11a and the drain contact region 11b. The source 12 is provided above the source contact region 11a and connected to the source contact region 11a through a source via hole, and the drain 13 is provided above the drain contact region 11b and connected to the drain contact region 11b through a drain via hole. Thicknesses of the source contact region 11a and the drain contact region 11b are both greater than that of the channel region 11c.

Figure 4:
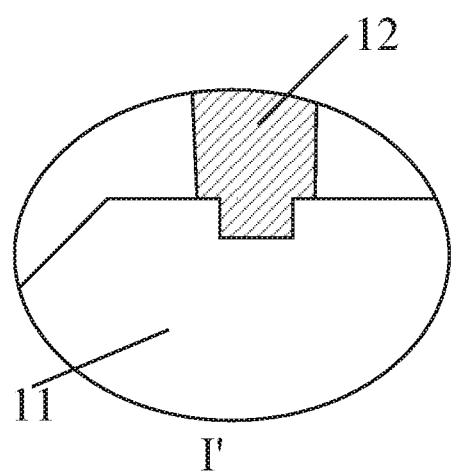
FIG. 4 is an enlarged schematic view of Portion I' of the low temperature poly-silicon thin film transistor in FIG. 3 in the case of over etching.

Compared with the prior art, since the thicknesses of the source contact region 11a and the drain contact region 11b are greater than that of the channel region 11c, even if certain recesses are formed in the source contact region 11a and the drain contact region 11b due to over etching during etching the via hole, the source and the drain still have relatively large contact areas with the active layer, as shown in FIG. 4. As a result, reliability and yield of the low temperature poly-silicon thin film transistor are improved, meanwhile, contact resistance is decreased, and both turn-on voltage and power consumption of a driving circuit are reduced. Moreover, in the channel region which is relatively thin, poly-silicon grains are prone to growing laterally, so that the grains have relatively large lateral size, and the active layer of the thin film transistor is anisotropic, and thus the active layer of the thin film transistor has better conductivity when the thin film transistor is turned on.

In order to enable the source 12 and the drain 13 to come into better contact with the active layer 11, further, an ohmic contact layer may be provided between the source contact region 11a and the source 12 and between the drain contact region 11b and the drain, so as to reduce contact resistances between the source 12 and the active layer 11 and between the drain 13 and the active layer 11.

In order to facilitate the fabrication of the active layer, in an embodiment of the present invention, the thickness of the source contact region 11a may be the same as that of the drain contact region 11b.

In addition, as shown in FIG. 3, the low temperature poly-silicon thin film transistor may further comprise a gate 14 and a gate insulating layer 15 provided between the gate 14 and the active layer 11, and the gate insulating layer 15 is provided on the active layer 11, in order to separate and insulate the gate 14 from the active layer 11.

Further, the low temperature poly-silicon thin film transistor may further comprise an interlayer insulating layer 16 provided on the gate 14, the source 12 and the drain 13 are connected to the active layer 11 through the source via hole and the drain via hole which are provided in the interlayer insulating layer 16, respectively, and the source via hole and the drain via hole both pass through the gate insulating layer 15 and the interlayer insulating layer 16.

In the embodiment of the present invention, the materials of the gate insulating layer 15 and the interlayer insulating layer 16 are not limited, and may be a silicon oxide layer (SiOx), a silicon nitride layer (SiNx), a silicon oxynitride layer (SiON), etc. For example, the gate insulating layer 15 may comprise a silicon oxide layer provided on the active layer and a silicon nitride layer provided on the silicon oxide layer. For example, the interlayer insulating layer 16 may comprise a silicon oxide layer and a silicon nitride layer provided on the gate. Direct contact between a silicon oxide layer and the active layer or the gate can improve interface properties of the active layer or the gate, and ensure conductivity of the active layer or the gate. A silicon nitride has a high dielectric constant, and has good insulating effect.

It should be understood that, as shown in FIG. 3, a buffer layer 17, which is made of an insulating material, may further be provided between the active layer 11 and a substrate 10. For example, the buffer layer may comprise a single-layer film formed by any one of silicon oxide (SiOx), silicon nitride (SiNx), silicon oxynitride (SiON), aluminum oxide ($Al_2O_3$) and the like, or a composite film layer formed by two or more of the foregoing materials. Since in fabricating the active layer of the low temperature poly-silicon thin film transistor, laser annealing needs to be used to convert amorphous silicon into poly-silicon, the impact of high temperature on the substrate 10 can be decreased by providing the buffer layer.

Figure 5:
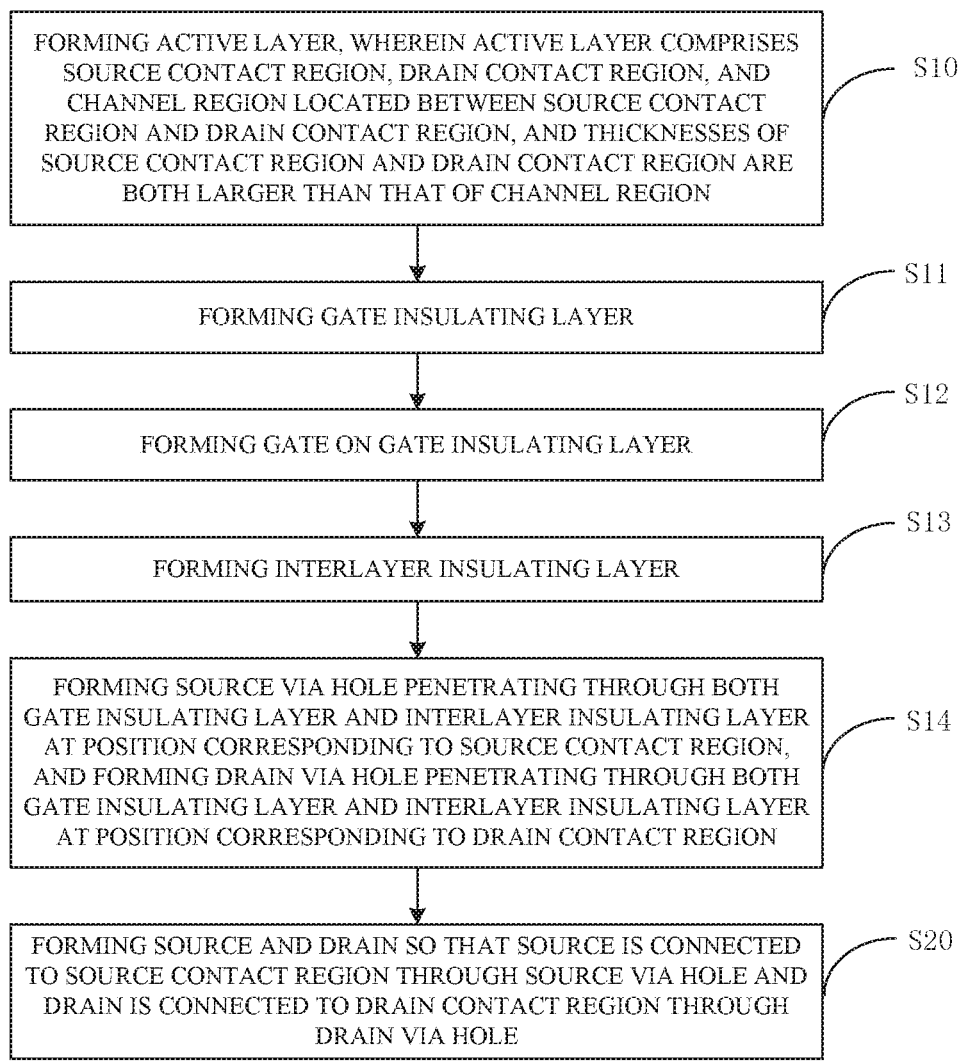
FIG. 5 is a flowchart of a method for fabricating a low temperature poly-silicon thin film transistor of an embodiment of the present invention.

As a second aspect of the present invention, the embodiments of the present invention provide a method for fabricating a low temperature poly-silicon thin film transistor. As shown in FIG. 5, the method may comprise steps S10 and S20 as below.

Step S10 comprises forming an active layer. The active layer comprises a source contact region, a drain contact region, and a channel region located between the source contact region and the drain contact region, and the thicknesses of the source contact region and the drain contact region are both greater than that of the channel region.

Step S20 comprises forming a source and a drain, wherein the source is connected to the source contact region through a source via hole, and the drain is connected to the drain contact region through a drain via hole.

In some embodiments, before step S10, the method may further comprise forming a buffer layer 17 on a substrate 10.

In some embodiments, step S10 may comprise the following steps S10a to S10e.

Figure 6A:
FIGS. 6a to 6e are schematic diagrams illustrating steps for fabricating an active layer of an embodiment of the present invention.

Step S10a comprises forming a first amorphous silicon material layer 21, as shown in FIG. 6a.

Figure 6B:
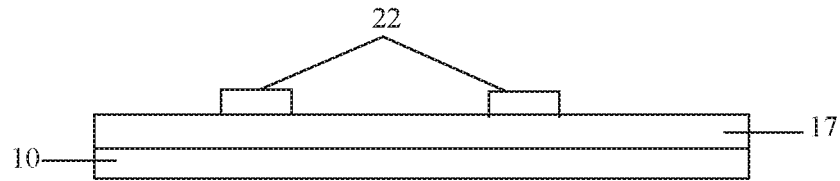

Step S10b comprises forming a photoresist layer on the first amorphous silicon material layer, and performing a patterning process to maintain portions of the first amorphous silicon material layer located in a first region and a second region with other portions being removed, so as to form a first intermediate pattern 22, as shown in FIG. 6b. In this step, the first region corresponds to the position where the source contact region is located, and the second region corresponds to the position where the drain contact region is located.

Figure 6C:
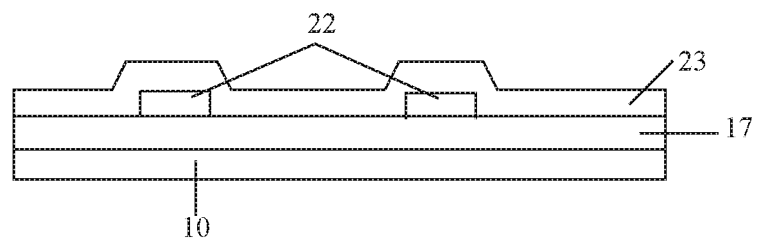

Step S10c comprises forming a second amorphous silicon material layer 23, as shown in FIG. 6c.

Figure 6D:
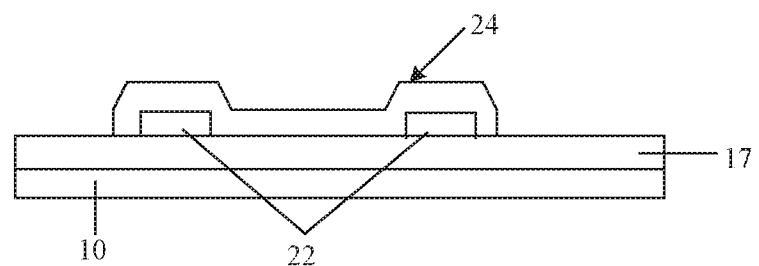

Step S10d comprises forming a photoresist layer on the second amorphous silicon material layer, and performing a patterning process to maintain portions of the second amorphous silicon material layer located in the first region, the second region and a third region with other portions being removed, so as to form a second intermediate pattern 24, as shown in FIG. 6d. In this step, the third region corresponds to the position where the channel region is located.

Figure 6E:
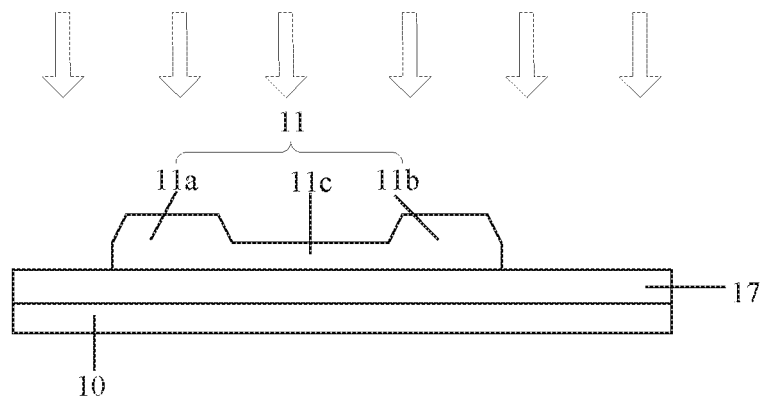

Step S10e comprises performing annealing on the first intermediate pattern 22 and the second intermediate pattern 24 to form the active layer 11, as shown in FIG. 6e. In this step, a portion of the active layer 11 located in the first region is the source contact region, a portion of the active layer 11 located in the second region is the drain contact region, and a portion of the active layer 11 located in the third region is the channel region. For example, an excimer laser annealing process may be adopted during annealing.

In some embodiments, the method may further comprise performing ion doping on the source contact region and the drain contact region to form an Ohmic contact layer.

In some embodiments, as shown in FIG. 5, the method may further comprise, between step S10 and step S20, steps S11 to S14 as follows.

Step S11 comprises forming a gate insulating layer. In this step, a silicon oxide layer and a silicon nitride layer may be sequentially formed over the active layer.

Step S12 comprises forming a gate on the gate insulating layer. Specifically, a gate material layer may be formed on the gate insulating layer, and then a pattern comprising the gate is formed by a photolithographic patterning process. The gate may be made of any one or more of molybdenum (Mo), molybdenum-niobium alloy (MoNb), aluminum (Al), titanium (Ti), and copper (Cu).

Step S13 comprises forming an interlayer insulating layer. In this step, a silicon oxide layer and a silicon nitride layer may be sequentially formed over the gate.

Step S14 comprises forming a source via hole penetrating through both the gate insulating layer and the interlayer insulating layer at a position corresponding to the source contact region, and forming a drain via hole penetrating through both the gate insulating layer and the interlayer insulating layer at a position corresponding to the drain contact region, so that the source is connected to the source contact region through the source via hole, and the drain is connected to the drain contact region through the drain via hole. The source via hole and the drain contact region may be formed by a photolithography process.

As a third aspect of the present invention, an embodiment of the present invention provides an array substrate, comprising the aforementioned low temperature poly-silicon thin film transistor provided by the embodiments of the present invention.

Figure 7:
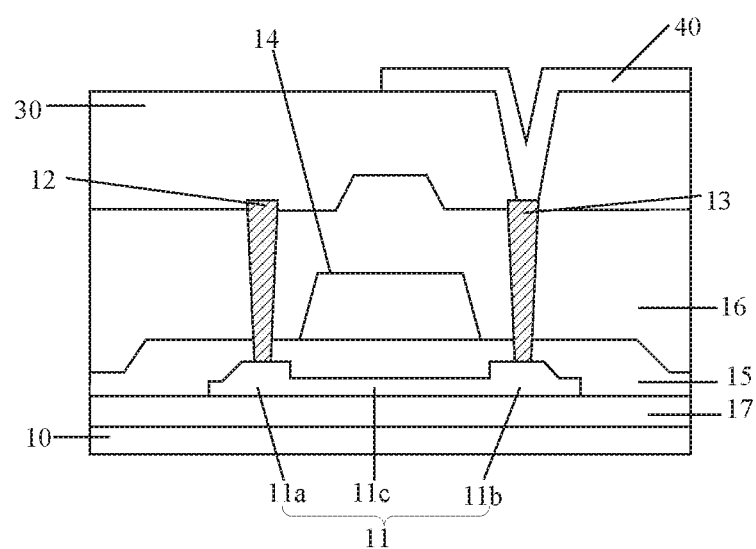
FIG. 7 is a schematic structure diagram of an array substrate of an embodiment of the present invention.

As shown in FIG. 7, the array substrate further comprises a planarization layer 30 provided on the low temperature poly-silicon thin film transistor, and a pixel electrode 40 provided on the planarization layer 30. A pixel electrode via hole, through which the pixel electrode 40 is connected to the drain 13 of the low temperature poly-silicon thin film transistor, is provided in the planarization layer 30.

As a fourth aspect of the present invention, an embodiment of the present invention provides a display device, comprising the aforementioned array substrate provided by the present invention. The display device may be any product or component with a display function, such as a mobile phone, a tablet computer, a television, a display, a notebook computer, a digital photo frame, or a navigator.

In the low temperature poly-silicon thin film transistor provided by the embodiments of the present invention, since the thicknesses of the source contact region and the drain contact region in the active layer are both greater than that of the channel region, the source and the drain have relatively large contact areas with the active layer, and poly-silicon in the channel region is prone to growing laterally to form relative large grains, thus improving electrical properties and uniformity of the low temperature poly-silicon thin film transistor, and further improving reliability of the array substrate and the display device. Meanwhile, due to decreased contact resistance between the source, the drain and the active layer, both turn-on voltage and power consumption of a driving circuit are reduced, thereby lowering power consumption of a display device.

It should be understood that, the aforementioned implementations are merely exemplary implementations used for describing the principle of the present invention, but the present invention is not limited thereto. For a person of ordinary skill in the art, various variations and improvements may be made without departing from the spirit and essence of the present invention, and these variations and improvements also fall within the protection scope of the present invention.

What is claimed is:

1. A low temperature poly-silicon thin film transistor, comprising an active layer, a source and a drain, a gate provided above the active layer; and a gate insulating layer provided between the gate and the active layer, wherein
the active layer comprises a source contact region, a drain contact region, and a channel region located between the source contact region and the drain contact region,
the source is provided above and connected to the source contact region, and the drain is provided above and connected to the drain contact region,
thicknesses of the source contact region and the drain contact region are both larger than that of the channel region,
the gate insulating layer comprises a silicon oxide layer provided on the active layer and contacting the active layer and a silicon nitride layer provided on a side of the silicon oxide layer distal to the active layer, and
a groove is formed on a surface of the source contact region contacting the source, and a groove is formed on a surface of the drain contact region contacting the drain.

2. The low temperature poly-silicon thin film transistor of claim 1, wherein an ohmic contact layer is provided between the source contact region and the source and between the drain contact region and the drain.

3. The low temperature poly-silicon thin film transistor of claim 1, wherein the thickness of the source contact region is the same as that of the drain contact region.

4. The low temperature poly-silicon thin film transistor of claim 1, further comprising:
an interlayer insulating layer provided on the gate; and
a source via hole and a drain via hole each penetrating through the gate insulating layer and the interlayer insulating layer, wherein the source is connected to the source contact region through the source via hole, and the drain is connected to the drain contact region through the drain via hole.

5. The low temperature poly-silicon thin film transistor of claim 4, wherein the interlayer insulating layer comprises a silicon oxide layer provided on the gate and a silicon nitride layer provided on the silicon oxide layer.

6. An array substrate, comprising the low temperature poly-silicon thin film transistor of claim 1.

7. A display device, comprising the array substrate of claim 6.

8. A method for fabricating a low temperature poly-silicon thin film transistor, comprising:
forming an active layer, wherein the active layer comprises a source contact region, a drain contact region, and a channel region located between the source contact region and the drain contact region, and thicknesses of the source contact region and the drain contact region are both larger than that of the channel region; and
forming a source and a drain above the source contact region and the drain contact region, respectively, so that the source is connected to the source contact region and the drain is connected to the drain contact region,
wherein the method further comprises forming a gate insulating layer on the active layer; and forming a gate on the gate insulating layer, wherein the gate insulating layer comprises a silicon oxide layer formed on the active layer and contacting the active layer and a silicon nitride layer formed on a side of the silicon oxide layer distal to the active layer, and
wherein a groove is formed on a surface of the source contact region contacting the source, and a groove is formed on a surface of the drain contact region contacting the drain.

9. The method of claim 8, wherein forming the active layer comprises:
forming a first amorphous silicon material layer;
forming a photoresist layer on the first amorphous silicon material layer, and performing a patterning process to maintain portions of the first amorphous silicon material layer located in a first region and a second region with other portions being removed, so as to form a first intermediate pattern, wherein the first region corresponds to a position where the source contact region is located, and the second region corresponds to a position where the drain contact region is located;
forming a second amorphous silicon material layer;
forming a photoresist layer on the second amorphous silicon material layer, and performing a patterning process to maintain portions of the second amorphous silicon material layer located in the first region, the second region and a third region with other portions being removed, so as to form a second intermediate pattern, wherein the third region corresponds to a position where the channel region is located; and
performing annealing on the first intermediate pattern and second intermediate pattern, so as to form the active layer.

10. The method of claim 9, wherein an excimer laser annealing process is adopted to perform annealing on the first intermediate pattern and the second intermediate pattern.

11. The method of claim 10, wherein poly-silicon laterally grows in the channel region having a smaller thickness, so as to form poly-silicon with a large grain size in the channel region.

12. The method of claim 10, wherein before forming the active layer, the method further comprises forming a buffer layer on a substrate.

13. The method of claim 8, further comprising:
performing ion doping on the source contact region and the drain contact region to form an ohmic contact layer.

14. The method of claim 8, further comprising:
forming an interlayer insulating layer on the gate; and
forming a source via hole penetrating through both the gate insulating layer and the interlayer insulating layer at a position corresponding to the source contact region, and forming a drain via hole penetrating through both the gate insulating layer and the interlayer insulating layer at a position corresponding to the drain contact region.

15. The method of claim 14, wherein the source is connected to the source contact region through the source via hole, and the drain is connected to the drain contact region through the drain via hole.

16. The method of claim 14, wherein forming the interlayer insulating layer comprises: sequentially forming a silicon oxide layer and a silicon nitride layer on the gate.

* * * * *